United States Patent
Mou et al.

(10) Patent No.: US 7,623,382 B2
(45) Date of Patent: Nov. 24, 2009

(54) SEMICONDUCTOR MEMORY AND ADDRESS-DECODING CIRCUIT AND METHOD FOR DECODING ADDRESS

(75) Inventors: Chi Yuan Mou, Taipei (TW); Chien Hao Lu, Hsinchu (TW); Wen Pin Hsieh, Hsinchu (TW); Ya Chun Chang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 194 days.

(21) Appl. No.: 11/649,816

(22) Filed: Jan. 5, 2007

(65) Prior Publication Data

US 2008/0002511 A1 Jan. 3, 2008

(30) Foreign Application Priority Data

Jun. 30, 2006 (TW) .............. 95123755 A

(51) Int. Cl.
G11C 11/34 (2006.01)
G11C 16/04 (2006.01)
G11C 8/00 (2006.01)

(52) U.S. Cl. .................... 365/185.11; 365/230.06; 365/230.08

(58) Field of Classification Search ............ 365/185.11, 365/230.06, 230.08
See application file for complete search history.

(56) References Cited

U.S. PATENT DOCUMENTS

| | | | | |
|---|---|---|---|---|
| 4,441,155 A | * | 4/1984 | Fletcher et al. ............... 711/3 |
| 4,550,367 A | * | 10/1985 | Hattori et al. ................. 711/5 |
| 4,723,283 A | * | 2/1988 | Nagasawa et al. ............ 380/240 |
| 4,989,185 A | * | 1/1991 | Matsuo et al. ......... 365/185.11 |
| 5,093,783 A | * | 3/1992 | Kitada ........................ 711/220 |
| 5,590,301 A | * | 12/1996 | Guenthner et al. .......... 711/202 |
| 5,602,999 A | * | 2/1997 | Hyatt ........................... 711/1 |
| 5,774,409 A | * | 6/1998 | Yamazaki et al. ...... 365/230.03 |
| 5,936,975 A | * | 8/1999 | Okamura ..................... 714/719 |
| 6,240,040 B1 | * | 5/2001 | Akaogi et al. .......... 365/230.06 |
| 6,771,557 B2 | * | 8/2004 | Penney ................... 365/230.06 |
| 2001/0038554 A1 | * | 11/2001 | Takata et al. ............ 365/185.09 |
| 2002/0114205 A1 | * | 8/2002 | Tsuruda et al. ......... 365/230.01 |
| 2002/0163428 A1 | * | 11/2002 | Weng ........................ 340/506 |
| 2005/0057995 A1 | * | 3/2005 | Mitani et al. ................ 365/222 |

FOREIGN PATENT DOCUMENTS

JP 02082841 A * 3/1990

* cited by examiner

*Primary Examiner*—Ly D Pham
(74) *Attorney, Agent, or Firm*—Volentine & Whitt, P.L.L.C.

(57) ABSTRACT

A semiconductor memory and address-decoding circuit and method for decoding address allow the semiconductor memory to operate under a decreased capacity by disabling or hiding a predetermined portion of the semiconductor memory. The semiconductor memory has a first address-inputting circuit configured to receive a first external address, a switching circuit configured to switch a predetermined portion of the first external address to form an internal address, at least one address-setting code configured to set at least one predetermined bit of the internal address, a decoder coupling to the switching circuit and the address-setting code, and a memory array coupling to the decoder, wherein the decoder is configured to select at least one memory unit of the memory array based on the internal address. The first address-inputting circuit, the switching circuit and the address-setting code can be considered as an address-decoding circuit.

25 Claims, 6 Drawing Sheets

US 7,623,382 B2

SEMICONDUCTOR MEMORY AND ADDRESS-DECODING CIRCUIT AND METHOD FOR DECODING ADDRESS

BACKGROUND OF THE INVENTION (A) Field of the Invention

The present invention relates to a semiconductor memory and address-decoding circuit and method for decoding address, and more particularly, to a semiconductor memory and address-decoding circuit and method for decoding address by setting at least one bit of the address to disable a predetermined portion of the semiconductor memory.

(B) Description of the Related Art

The semiconductor memory is prepared by a series of fabrication processes such as lithographic process, etching process, and deposition process to form memory units and accessing circuits on the wafer, which is then sliced into several die and encapsulated after testing. However, it is unavoidable that some of the semiconductor memories prepared by the above fabrication process have defective memory cells without normal access function due to process variation.

Generally, semiconductor memory units with defective memory cells are pulled out during the testing process and discarded to prevent selling failed products on the market. To reduce the quantity of the discarded memory, the redundancy technique and the error correction code technique are used to allow semiconductor memory with small numbers of defective memory cells to operate normally. Consequently, the product yield can be increased.

In addition, semiconductor memory with different capacities, for example, 32 Mb or 64 Mb, are sold on the market for different applications. The manufacture of semiconductor memory requires different fabrication processes to manufacture different semiconductor memories of different capacities, which increases the fabrication cost.

SUMMARY OF THE INVENTION

One aspect of the present invention provides a semiconductor memory and address-decoding circuit and method for decoding address, which allows the semiconductor memory to operate under a decreased capacity by disabling or hiding a predetermined portion of the semiconductor memory.

A semiconductor memory according to this aspect of the present invention comprises a first address-inputting circuit configured to receive a first external address, a switching circuit configured to switch a predetermined portion of the first external address to form an internal address, at least one global address-setting code configured to set at least one predetermined bit of the internal address, a decoder coupling to the switching circuit and the global address-setting code, and a memory array coupling to the decoder, wherein the decoder is configured to select at least one memory unit of the memory array based on the internal address. The first address-inputting circuit, the switching circuit and the address-setting code can be considered as an address-decoding circuit.

The memory array comprises a plurality of sectors, and the predetermined bit set by the global address-setting code can be a sector-selecting bit. For example, the first external address has a number of bits smaller than the number of bits of the internal address, and includes a switching bit corresponding to the sector-selecting bit, and the switching circuit is configured to shift the switching bit and higher bits above the switching bit by predetermined bits such that the first external address can be converted into the internal address.

The address-setting code can be stored in a non-volatile memory or set by a fuse or a metal option process. Preferably, the memory array includes a plurality of memory banks of different capacities, and the predetermined bit is preferably not the highest bit of the internal address. The decoder includes a plurality of decoding circuits configured to select at least one memory unit of the memory banks, and a plurality of address-setting code are configured to set the predetermined bit of the internal address sent to the decoding circuit.

Another aspect of the present invention provides a method for decoding addresses of a semiconductor memory comprising the steps of receiving an external address, switching a predetermined portion of the external address to form an internal address, reading an address-setting code to set at least one predetermined bit of the internal address and decoding the internal address to select at least one memory unit of a memory array.

The semiconductor memory of the present invention can use the address-setting bit to set a sector-selecting bit of the internal address such that a portion of the semiconductor memory can be hidden to decrease the memory capacity or disable memory units with defects, and the semiconductor memory is allowed to operate under a decreased capacity. In particular, the present invention can disable a predetermined memory sector under the same memory hierarchy without affecting the original accessing function of the semiconductor memory.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
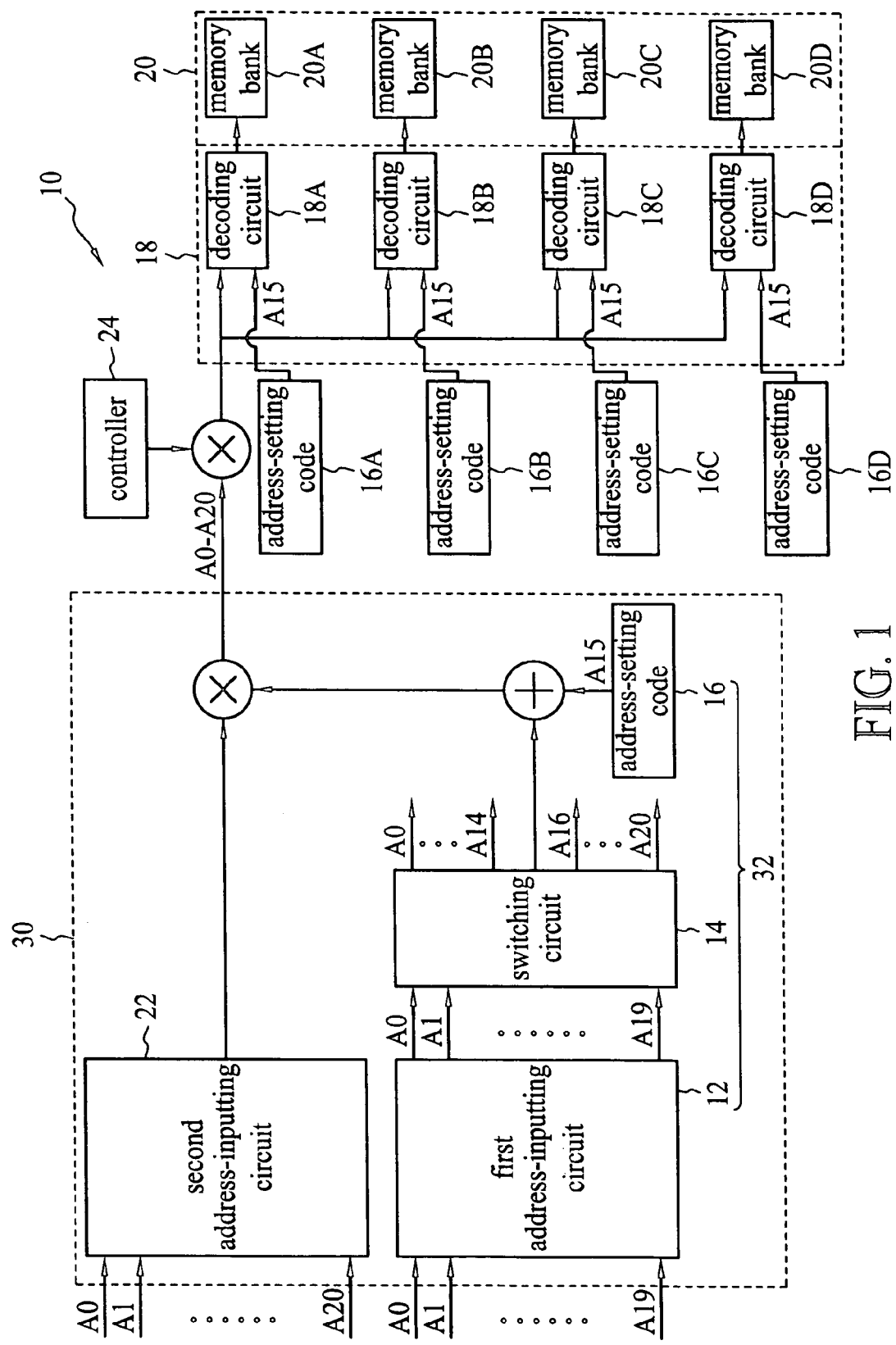
FIG. 1 and FIG. 2 illustrate a semiconductor memory according to one embodiment of the present invention.
Figure 2:
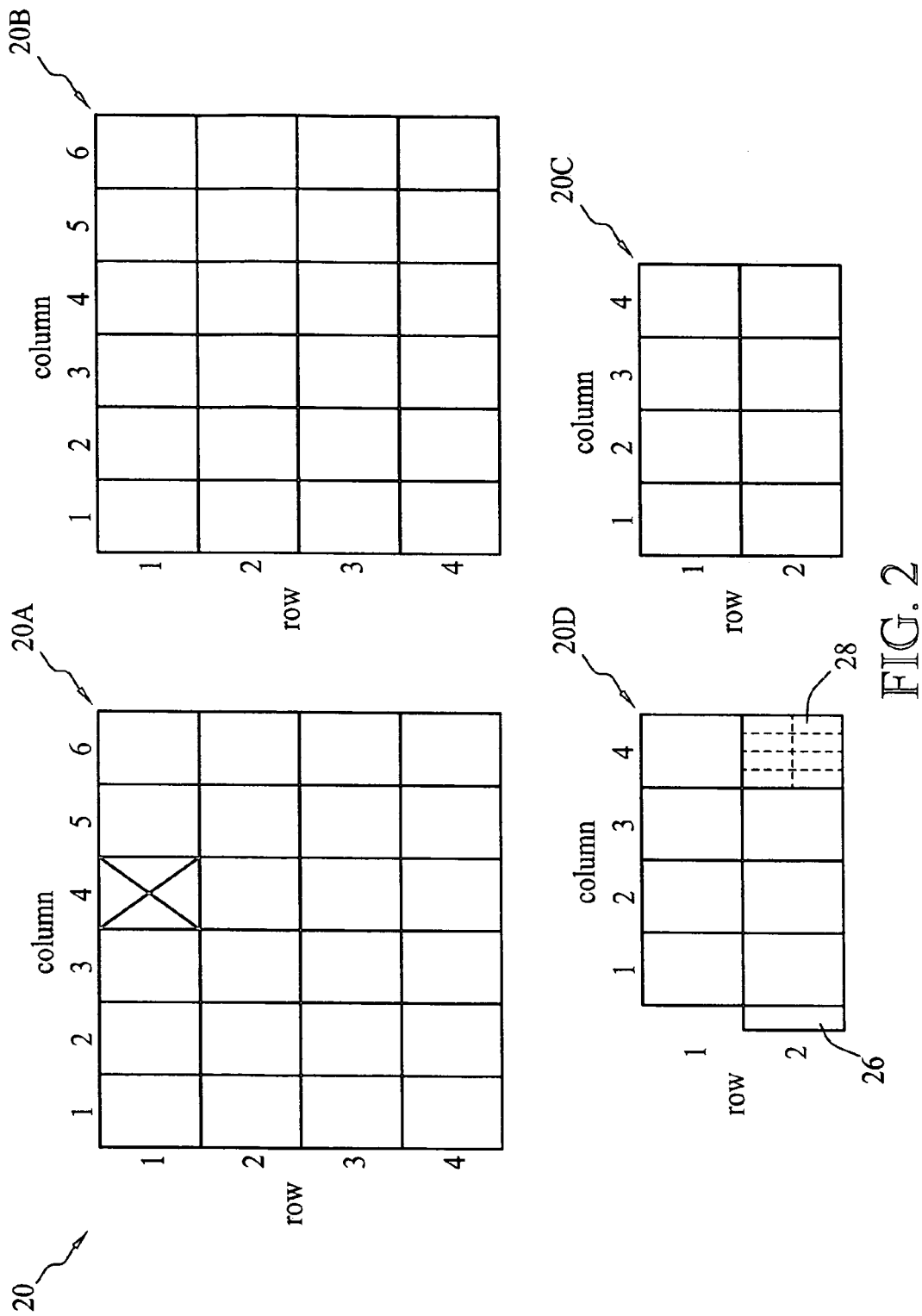

FIG. 1 and FIG. 2 illustrate a semiconductor memory 10 according to one embodiment of the present invention. The semiconductor memory 10 comprises a first address-inputting circuit 12 configured to receive a first external address (20 bits, A0-A19), a second address-inputting circuit 22 configured to receive a second external address (21 bits, A0-A20), a switching circuit 14 configured to switch a predetermined portion of the first external address to form an internal address (21 bits, A0-A20), at least one address-setting code 16 configured to set at least one predetermined bit of the internal address, a decoder 18 coupling to the switching circuit 14 and the address-setting code 16, a memory array 20 coupling to the decoder 18 and a controller 24 configured to control the access of the semiconductor memory 10. In particular, the first address-inputting circuit 12, the switching circuit 14 and the address-setting code 16 can be considered as a address-decoding circuit 32, and the second address-inputting circuit 22 and the address-decoding circuit 32 can be considered as an address buffer 30.

The memory array 20 includes four memory banks 20A, 20B, 20C and 20D, and the decoder 18 includes four decoding circuits 18A, 18B, 18C and 18D; each is configured to select at least one memory unit of the memory bank based on the internal address. For example, the decoding circuit may select 8 memory units or 16 memory units to form a word. The four memory banks 20A, 20B, 20C and 20D have different capacities and hierarchies, the memory banks 20A and 20B have 4 rows×6 columns=24 sectors, and the memory banks 20C and 20D have 2 rows×4 columns=8 sectors. In particular, the memory array 20 can support read-while-write (RWW) function, i.e., the four memory banks 20A, 20B, 20C and 20D can perform different access functions at the same time. Furthermore, the memory bank 20D also includes a security sector 26.

The memory array 20 shown in FIG. 2 operates under non-page mode, the memory bank 20D includes a boot sector 28 having eight sub-sectors, and the boot sector 28 is assigned to the second row of the memory bank 20D. The following description uses the semiconductor memory 10 operating under the non-page mode, but the present invention can also be applied to the semiconductor memory operating under page mode.

Figure 3A:
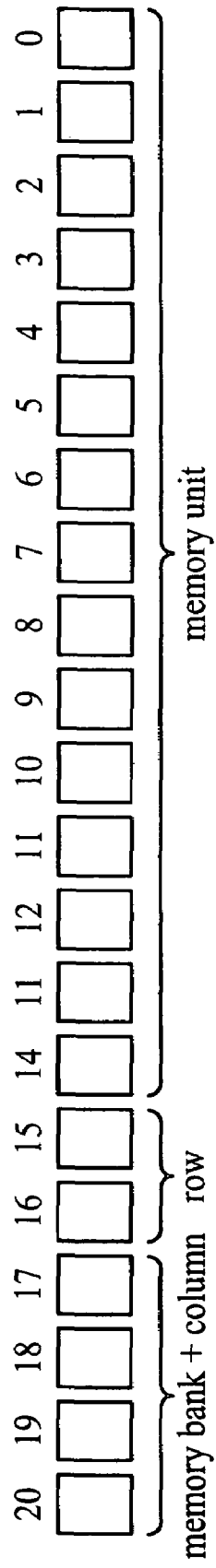
FIG. 3(a) and FIG. 3(b) illustrate the address of the semiconductor array.
Figure 3B:
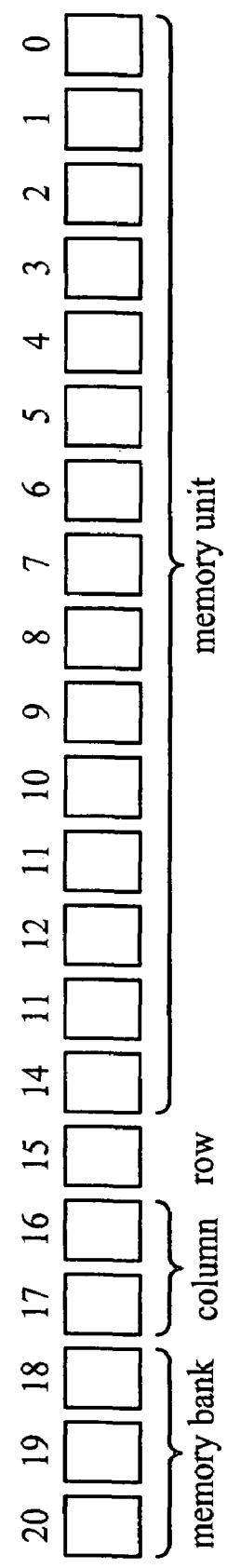

FIG. 3(a) and FIG. 3(b) illustrate the address of the semiconductor array 20, wherein FIG. 3(a) applies to the memory banks 20A and 20B, and FIG. 3(b) applies to the memory banks 20C and 20D. The internal address of the memory array 20 includes 21 bits (A0-A20), the lower bits (A0-A14) below the fifteenth bit (A14) are used to select memory units in a certain sector, and the higher bits above the sixteenth bit (A15) are used to select memory banks and sectors.

Referring to FIG. 3(b) and FIG. 2, the sectors of the memory banks 20C and 20D are arranged in a 2 rows×4 columns manner, which requires one bit (A15) to select the rows and two bits (A16 and A17) to select the columns. In addition, the high bits (A18-A20) <111> and <000> are used to select the memory banks 20C and 20D.

Referring to FIG. 3(a) and FIG. 2, the sectors of the memory banks 20A and 20B are arranged in a 4 rows×6 columns manner, which requires two bits (A15 and A16) to select the rows. In addition, the high bits of the internal address (A18-A20) <001>, <010>, <011> designate the memory bank 20A, and incorporate another bit (A17) to designate one of the six columns of the memory bank 20A. Similarly, the high bits of the internal address (A18-A20) <100>, <101>, <110> designate the memory bank 20B, and incorporate another bit (A17) to designate one of the six columns of the memory bank 20B.

Figure 4A:
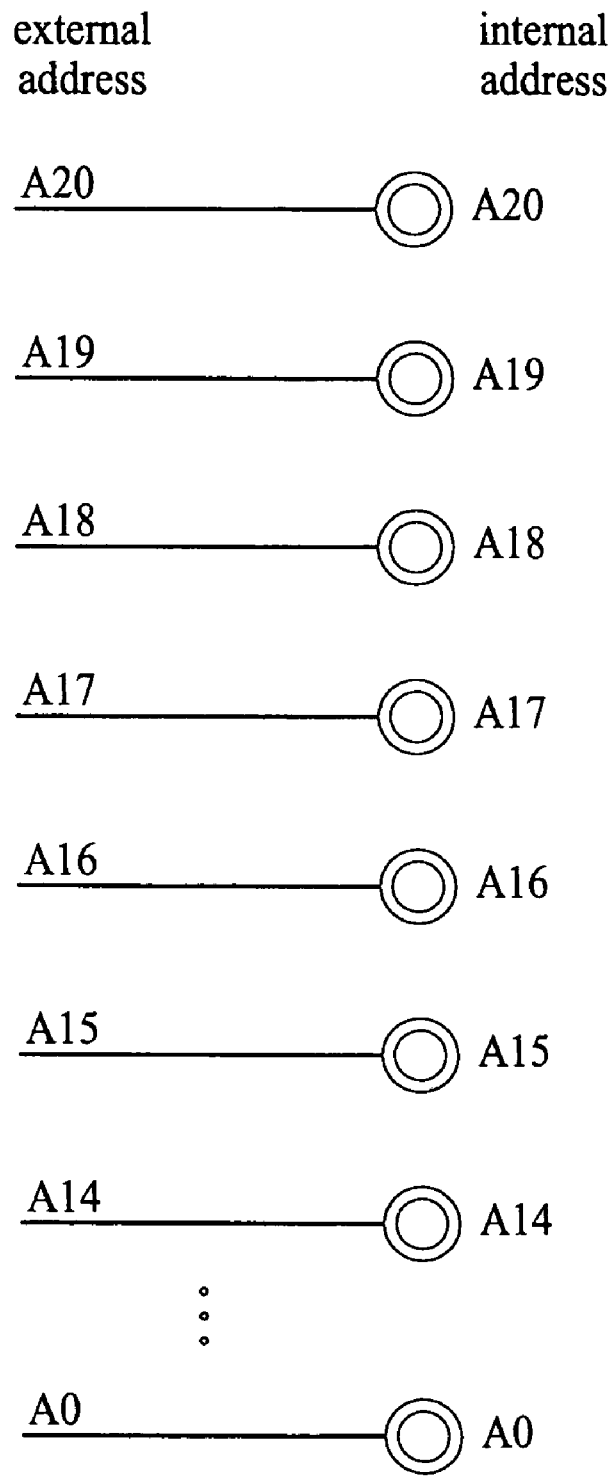
FIG. 4(a) and FIG. 4(b) illustrate the bit-shifting operation according to one embodiment of the present invention.
Figure 4B:
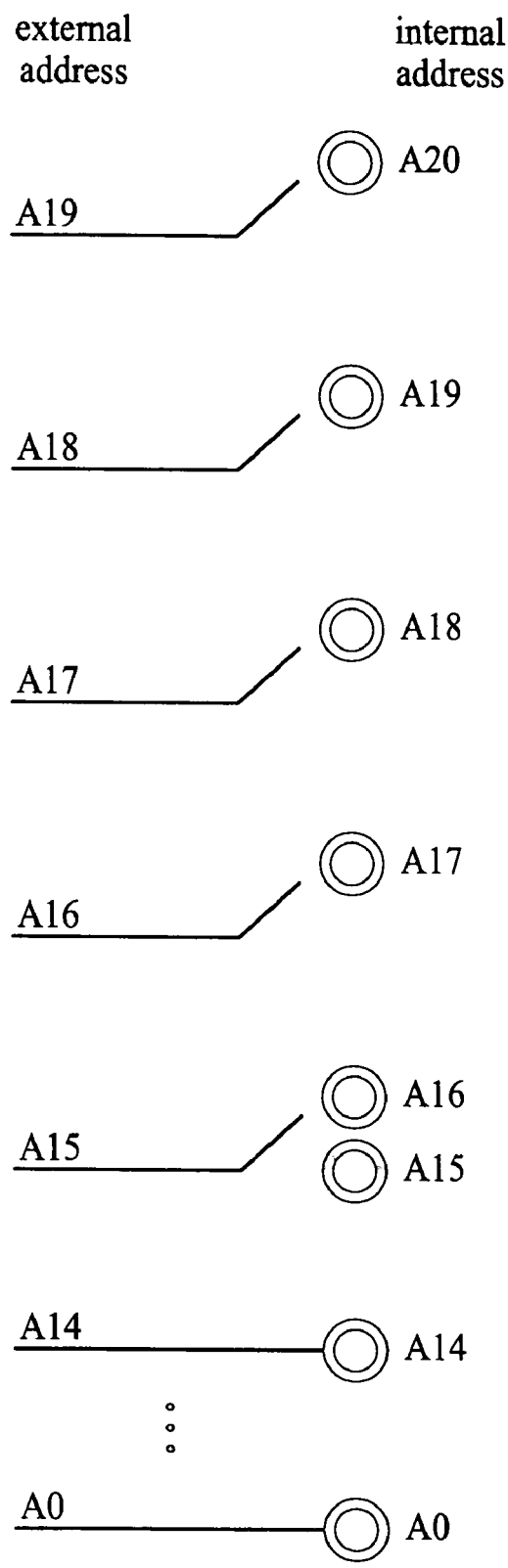

FIG. 4(a) and FIG. 4(b) illustrate the bit-shifting operation according to one embodiment of the present invention. The semiconductor memory 10 under normal operation receives the second external address via the second address-inputting circuit 22, and the number of bits of the second external address is the same as that of the internal address, i.e., 21 bits (A0-A20), as shown in FIG. 4(a). The first address-inputting circuit 12, the switching circuit 14 and the address-setting code 16 are disabled under normal operation.

Referring to FIG. 4(b), when a certain portion of the memory array 20 has defective memory cells and can not operate normally, the present invention can set at least one predetermined bit of the internal address to disable the sector having the defective memory cells such that the semiconductor memory 20 is allowed to operate correctly with a decreased capacity. For example, if the defective memory cells are located at the first row and the fourth column of the memory bank 20A, the present invention can disable the second address-inputting circuit 22 and enable the first address-inputting circuit 12 to receive the first external address with 20 bits (A0-A19), which is smaller than that of the internal address (A0-A20). The first external address has a switching bit (A15) corresponding to a sector-selecting bit (for example: A15) of the internal address.

The switching circuit 14 shifts the switching bit and higher bits above is the switching bit by one bit and the other bits below the switching bits are keep the same such that the first external address can be converted into the internal address. That is, the switching bit (A15) of the first external address is connected to the seventh bit (A16) of the internal address, and the high bits (A16-A19) of the first external address are connected to the high bits (A17-A20) of the internal address. Subsequently, the address-setting code 16 is used to set the sector-selecting bit (A15) of the internal address such that the first external address of 20 bits is converted into the internal address of 21 bits. Consequently, the back-end decoder 18 can operate normally to select one memory unit based on the decoding of the 21-bit internal address.

In particular, setting the sector-selecting bit (A15) not only disables the sector at the first row and the third row of the memory bank 20A, but also disables the sector at the first row and the third row of the memory bank 20B. Similarly, the first rows of the memory banks 20C and 20D are also disabled. Consequently, the capacity of the memory array 20 is decreased by half, i.e., its memory density is decreased by half. Preferably, the disabled columns or rows do not include the boot sector 28.

Figure 5:
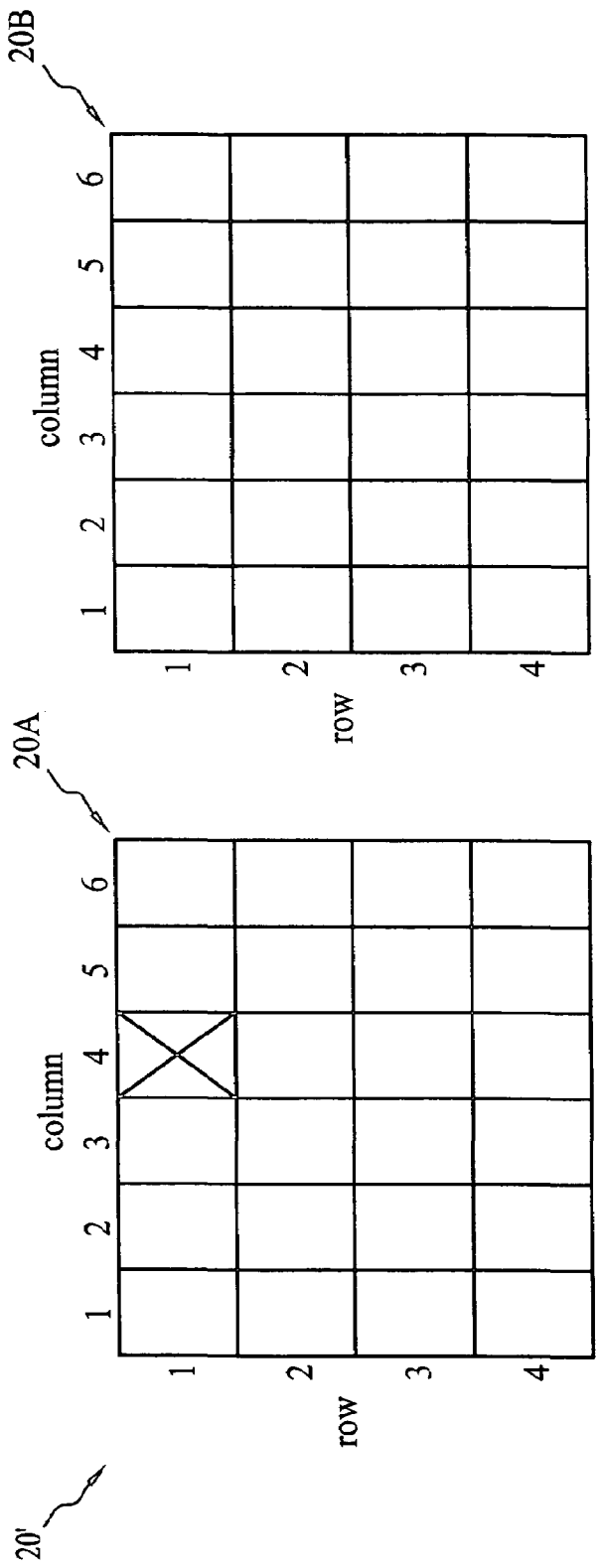
FIG. 5 illustrates a memory array operating under page mode according to one embodiment of the present invention.
Figure 5:
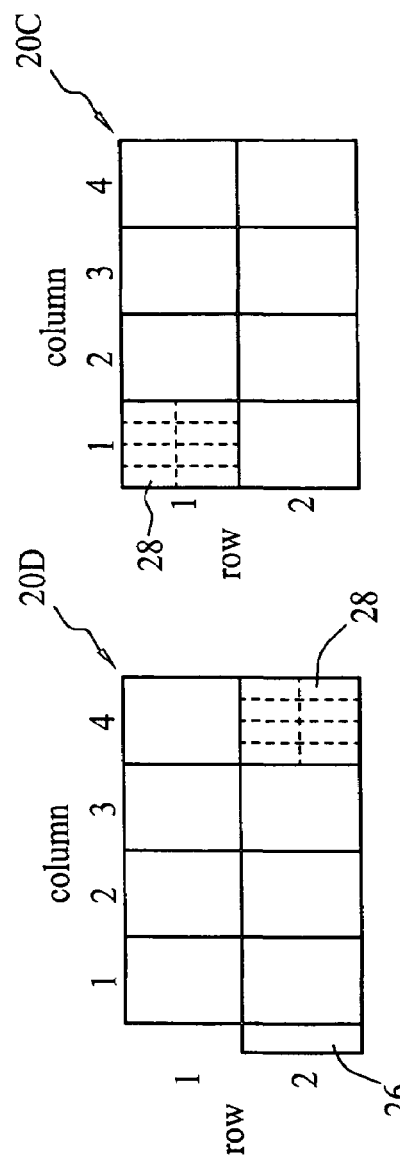

FIG. 5 illustrates a memory array 20' operating under page mode according to one embodiment of the present invention. Compared with the memory array 20 shown in FIG. 2 operating under non-page mode, the memory array 20' shown in FIG. 5 operates under page mode. The memory bank 20D of the memory array 20 has the boot sector 28 with eight sub-sectors assigned to the second row of the memory bank 20D, while the memory array 20' further has another boot sector 28 with eight sub-sectors assigned to the first row of the memory bank 20C in addition to the boot sector 28 assigned to the second row of the memory bank 20D. That is, the memory array 20' operating under page mode has two boot sectors 28 assigned to the memory banks 20C and 20D.

Referring back to FIG. 1, the semiconductor memory 10 may further include a plurality of address-setting codes 16A, 16B, 16C and 16D configured to set at least the predetermined bit (for example A15) of the internal address sent to the decoding circuits 18A, 18B, 18C and 18D. In particular, the address-setting code 16 can be considered as a global address-setting code, while the address-setting codes 16A, 16B, 16C and 16D can be considered as local address-setting codes.

Consequently, the memory units in a certain row or column of the four memory banks 20A, 20B, 20C and 20D can be optionally disabled. It is preferable that the disabled row or column does not include the boot sector 28 for the memory array 20' operating under page mode. In particular, using the local address-setting codes 16C and 16D to optionally disable the row or column without the boot sectors 28 allows the semiconductor memory 10 to operate under page mode.

The address-setting code 16 (or the address-setting codes 16A, 16B, 16C and 16D) is stored in a non-volatile memory. In addition, the address-setting code 16 can be set by a laser fuse to disable the sector having defective memory cells if the test process finds the semiconductor memory 10 includes the defective memory cells. Furthermore, the address-setting code 16 can be set by a metal option process during the fabrication of the semiconductor memory 10 such that the same fabrication process can be used to fabricate the semiconductor memories with different capacities, and the fabrication cost can be dramatically reduced.

Preferably, the predetermined bit set by the address-setting code 16 is not the bank-selecting bit such as A18, A19 and A20 or the highest bit of the internal address to maintain the bank number of the semiconductor memory 10. In particular, the present invention can disable a predetermined memory sector without changing the original hierarchy of the semiconductor memory 10 having the same memory banks. Consequently, the semiconductor memory 10 can still support the read-while-write function, i.e., the four banks 20A, 20B, 20C and 20D can perform different access functions at the same time.

The external address with 20 bits can not be directly decoded by the decoder 18 due to different specifications, i.e., the external address with 20 bits can be considered as random codes. The present invention uses the address-decoding circuit 32 consisting of the first address-inputting circuit 12, the switching circuit 14 and the address-setting code 16 to convert the external address with 20 bits into the internal address with 21 bits, which can be decoded by the decoder 18 at the back end. Consequently, two different addresses, one with 20 bits and the other with 21 bits, can apply to the semiconductor memory using the address buffer 30 according to the present invention.

In addition, the semiconductor memory 10 of the present invention can use the address-setting code 16 to set a sector-selecting bit of the internal address such that a portion of the semiconductor memory 10 can be hidden to decrease the memory capacity or disable memory units with defects, and the semiconductor memory 10 is allowed to operate under a decreased capacity. In particular, the present invention can disable a predetermined memory sector under the same memory hierarchy without affecting the original accessing function of the semiconductor memory 10.

The above-described embodiments of the present invention are intended to be illustrative only. Numerous alternative embodiments may be devised by those skilled in the art without departing from the scope of the following claims.

What is claimed is:

1. A semiconductor memory, comprising:
   a first address-inputting circuit configured to receive a first external address;
   a switching circuit configured to switch a predetermined portion of the first external address to form an internal address;
   at least one address-setting code configured to set at least one predetermined bit of the internal address, wherein the address-setting code is stored in a non-volatile memory;
   a decoder coupling to the switching circuit and the address-setting code; and
   a memory array coupling to the decoder, wherein the decoder is configured to select at least one memory unit of the memory array based on the internal address,
   wherein the first external address has a number of bits smaller than a number of bits of the internal address.

2. The semiconductor memory of claim 1, wherein the memory array comprises a plurality of sectors, and the predetermined bit is a sector-selecting bit.

3. The semiconductor memory of claim 2, wherein the first external address includes a switching bit corresponding to the sector-selecting bit, and the switching circuit is configured to shift the switching bit and higher bits above the switching bit by predetermined bits.

4. The semiconductor memory of claim 1, wherein the memory array includes a plurality of memory banks of different capacities, and the predetermined bit is not a bank-selecting bit.

5. The semiconductor memory of claim 1, wherein the predetermined bit is not the highest bit of the internal address.

6. The semiconductor memory of claim 1, further comprising a second address-inputting circuit configured to receive a second external address having a number of bits the same as the number of bits of the internal address.

7. The semiconductor memory of claim 1, wherein the memory array includes a plurality of memory banks, and one of the memory banks includes a boot sector.

8. The semiconductor memory of claim 7, operating in a page mode.

9. The semiconductor memory of claim 1, wherein the memory array includes a plurality of memory banks, and two of the memory banks include a boot sector.

10. The semiconductor memory of claim 9, operating in a non-page mode.

11. The semiconductor memory of claim 1, wherein the decoder includes a plurality of decoding circuits, and a plurality of address-setting codes are configured to individually set the predetermined bit of the internal address sent to the decoding circuits.

12. An address-decoding circuit, comprising:
   an address-inputting circuit configured to receive an external address;
   a switching circuit configured to switch a predetermined portion of the external address to form an internal address; and
   an address-setting code configured to set at least one predetermined bit of the internal address,
   wherein the address-setting code is stored in a non-volatile memory, and wherein the first external address has a number of bits smaller than a number of bits of the internal address.

13. The address-decoding circuit of claim 12, wherein the predetermined bit is a sector-selecting bit.

14. The address-decoding circuit of claim 13, wherein the first external address includes a switching bit corresponding to the sector-selecting bit, and the switching circuit is configured to shift the switching bit and higher bits above the switching bit by predetermined bits.

15. The address-decoding circuit of claim 12, coupling to a memory array including a plurality of memory banks of different capacities, and the predetermined bit being not a bank-selecting bit.

16. The semiconductor memory of claim 12, wherein the predetermined bit is not the highest bit of the internal address.

17. A method for decoding addresses of a semiconductor memory, comprising the steps of:
   receiving an external address;
   switching a predetermined portion of the external address to form an internal address;
   reading an address-setting code to set at least one predetermined bit of the internal address, wherein the address-setting code is stored in a non-volatile memory; and
   decoding the internal address to select at least one memory unit of a memory array,
   wherein the first external address has a number of bits smaller than a number of bits of the internal address.

18. The method for decoding addresses of a semiconductor memory of claim 17, wherein the memory array comprises a plurality of sectors, and the predetermined bit is a sector-selecting bit.

19. The method for decoding addresses of a semiconductor memory of claim 18, wherein the external address includes a switching bit corresponding to the sector-selecting bit, and the step of switching a predetermined portion of the external address is configured to shift the switching bit and higher bits above the switching bit by predetermined bits.

20. The method for decoding addresses of a semiconductor memory of claim 17, wherein the memory array includes a plurality of memory banks of different capacities, and the predetermined bit is not a bank-selecting bit.

21. The method for decoding addresses of a semiconductor memory of claim 17, wherein the predetermined bit is not the highest bit of the internal address.

22. The method for decoding addresses of a semiconductor memory of claim 17, wherein the memory array includes a plurality of memory banks, and one of the memory banks includes a boot sector.

23. The method for decoding addresses of a semiconductor memory of claim 22, wherein the semiconductor memory operates in a page mode.

24. The method for decoding addresses of a semiconductor memory of claim 17, wherein the memory array includes a plurality of memory banks, and each of two of the memory banks includes a boot sector.

25. The method for decoding addresses of a semiconductor memory of claim 24, wherein the semiconductor memory operates in a non-page mode.

* * * * *